(12) United States Patent
Thomas et al.

(10) Patent No.: US 7,576,995 B2
(45) Date of Patent: Aug. 18, 2009

(54) FLEX CIRCUIT APPARATUS AND METHOD FOR ADDING CAPACITANCE WHILE CONSERVING CIRCUIT BOARD SURFACE AREA

(75) Inventors: John Thomas, Round Rock, TX (US); Russell Rapport, Austin, TX (US); Robert Washburn, Austin, TX (US)

(73) Assignee: Entorian Technologies, LP, Austin, TX (US)

(*) Notice: Subject to any disclaimer, the term of this patent is extended or adjusted under 35 U.S.C. 154(b) by 256 days.

(21) Appl. No.: 11/267,476

(22) Filed: Nov. 4, 2005

(65) Prior Publication Data
US 2007/0103877 A1    May 10, 2007

(51) Int. Cl.
H05K 7/00    (2006.01)

(52) U.S. Cl. ............ 361/760; 361/306.3; 361/763; 361/301.1; 361/301.4; 174/262; 174/548

(58) Field of Classification Search ............ 361/760, 361/306.3, 763, 793, 749, 301.1, 301.4, 697, 361/709, 711, 712, 748–751, 761, 762; 174/260–266, 174/548
See application file for complete search history.

(56) References Cited

U.S. PATENT DOCUMENTS

| | | | |
|---|---|---|---|
| 3,436,604 A | 4/1969 | Hyltin | |
| 3,654,394 A | 4/1972 | Gordon | |
| 3,704,455 A | 11/1972 | Scarbrough | |
| 3,746,934 A | 7/1973 | Stein | |
| 3,766,439 A | 10/1973 | Isaacson | |
| 3,772,776 A | 11/1973 | Weisenburger | |
| 3,983,547 A | 9/1976 | Almasi | |
| 4,288,841 A | 9/1981 | Gogal | |
| 4,398,235 A | 8/1983 | Lutz et al. | |
| 4,406,508 A | 9/1983 | Sadigh-Behzadi | |
| 4,437,235 A | 3/1984 | McIver | |
| 4,466,183 A | 8/1984 | Burns | |
| 4,513,368 A | 4/1985 | Houseman | |
| 4,567,543 A | 1/1986 | Miniet | |
| 4,587,596 A | 5/1986 | Bunnell | |
| 4,645,944 A | 2/1987 | Uya | |
| 4,656,605 A | 4/1987 | Clayton | |
| 4,682,207 A | 7/1987 | Akasaki et al. | |
| 4,696,525 A | 9/1987 | Coller et al. | |
| 4,709,300 A | 11/1987 | Landis | |
| 4,733,461 A | 3/1988 | Nakano | |
| 4,758,875 A | 7/1988 | Fujisaki et al. | |
| 4,763,188 A | 8/1988 | Johnson | |
| 4,821,007 A | 4/1989 | Fields et al. | |
| 4,823,234 A | 4/1989 | Konishi et al. | |
| 4,833,568 A | 5/1989 | Berhold | |
| 4,850,892 A | 7/1989 | Clayton et al. | |

(Continued)

Primary Examiner—Dean A. Reichard
Assistant Examiner—Hoa C Nguyen
(74) Attorney, Agent, or Firm—Fish & Richardson P.C.

(57) ABSTRACT

An apparatus and a method for adding capacitance while conserving circuit board surface area. An apparatus for adding capacitance while conserving circuit board surface area includes a flex capacitor circuit with an upper surface and a lower surface and a plurality of conductive layers and an integrated-circuit (IC) device mounted on to the upper surface of the flex capacitor circuit and electrically connected to the flex capacitor circuit. The flex capacitor circuit is configured to provide bypass capacitance and, therefore, adds capacitance to the IC device when the IC device is mounted on the flex capacitor circuit.

3 Claims, 6 Drawing Sheets

U.S. PATENT DOCUMENTS

| | | |
|---|---|---|
| 4,862,249 A | 8/1989 | Carlson |
| 4,884,237 A | 11/1989 | Mueller et al. |
| 4,891,789 A | 1/1990 | Quattrini et al. |
| 4,894,706 A | 1/1990 | Sato et al. |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,050,039 A | 9/1991 | Edfors |
| 5,053,853 A | 10/1991 | Haj-Ali-Ahmadi et al. |
| 5,065,277 A | 11/1991 | Davidson |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow et al. |
| 5,140,405 A | 8/1992 | King et al. |
| 5,159,434 A | 10/1992 | Kohno et al. |
| 5,159,535 A | 10/1992 | Desai et al. |
| 5,191,404 A | 3/1993 | Wu et al. |
| 5,198,888 A | 3/1993 | Sugano et al. |
| 5,198,965 A | 3/1993 | Curtis et al. |
| 5,208,729 A | 5/1993 | Cipolla et al. |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,243,133 A | 9/1993 | Engle et al. |
| 5,247,423 A | 9/1993 | Lin et al. |
| 5,252,857 A | 10/1993 | Kane et al. |
| 5,253,010 A | 10/1993 | Oku et al. |
| 5,259,770 A | 11/1993 | Bates et al. |
| 5,261,068 A | 11/1993 | Gaskins et al. |
| 5,262,927 A | 11/1993 | Chia et al. |
| 5,268,815 A | 12/1993 | Cipolla et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,289,346 A | 2/1994 | Carey et al. |
| 5,311,401 A | 5/1994 | Gates et al. |
| 5,313,096 A | 5/1994 | Eide |
| 5,313,097 A | 5/1994 | Haj-Ali-Ahmadi et al. |
| 5,343,075 A | 8/1994 | Nishino |
| 5,345,205 A | 9/1994 | Kornrumpf |
| 5,347,428 A | 9/1994 | Carson et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,390,844 A | 2/1995 | Distefano et al. |
| 5,394,010 A | 2/1995 | Tazawa et al. |
| 5,394,300 A | 2/1995 | Yoshimura |
| 5,394,303 A | 2/1995 | Yamaji |
| 5,397,916 A | 3/1995 | Normington |
| 5,400,003 A | 3/1995 | Kledzik |
| 5,402,006 A | 3/1995 | O'Donley |
| 5,420,751 A | 5/1995 | Burns |
| 5,422,435 A | 6/1995 | Takiar et al. |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley et al. |
| 5,484,959 A | 1/1996 | Burns |
| 5,491,612 A | 2/1996 | Nicewarner et al. |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,548,091 A | 8/1996 | DiStefano et al. |
| 5,552,631 A | 9/1996 | McCormick |
| 5,561,591 A | 10/1996 | Burns |
| 5,566,051 A | 10/1996 | Burns |
| 5,572,065 A | 11/1996 | Burns |
| 5,579,207 A | 11/1996 | Hayden et al. |
| 5,588,205 A | 12/1996 | Roane |
| 5,592,364 A | 1/1997 | Roane |
| 5,594,275 A | 1/1997 | Kwon et al. |
| 5,600,541 A | 2/1997 | Bone et al. |
| 5,612,570 A | 3/1997 | Eide et al. |
| 5,625,221 A | 4/1997 | Kim et al. |
| 5,631,807 A | 5/1997 | Griffin |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,657,537 A | 8/1997 | Saia et al. |
| 5,659,952 A | 8/1997 | Kovac et al. |
| 5,677,566 A | 10/1997 | King et al. |
| 5,677,569 A | 10/1997 | Choi et al. |
| 5,714,802 A | 2/1998 | Cloud et al. |
| 5,715,144 A | 2/1998 | Ameen et al. |
| 5,729,894 A | 3/1998 | Rostoker et al. |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner et al. |
| 5,778,522 A | 7/1998 | Burns |
| 5,778,552 A | 7/1998 | LeGuin |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,805,424 A | 9/1998 | Purinton |
| 5,811,879 A | 9/1998 | Akram |
| 5,835,988 A | 11/1998 | Ishii |
| 5,844,168 A | 12/1998 | Schueller et al. |
| 5,861,666 A | 1/1999 | Bellaar |
| 5,869,353 A | 2/1999 | Levy et al. |
| 5,899,705 A | 5/1999 | Akram |
| 5,917,242 A | 6/1999 | Ball |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,977,640 A | 11/1999 | Bertin et al. |
| 5,995,370 A | 11/1999 | Nakamori |
| 6,002,167 A | 12/1999 | Hatano et al. |
| 6,002,589 A | 12/1999 | Perino et al. |

| | | | |
|---|---|---|---|
| 6,013,948 A | 1/2000 | Akram et al. | |
| 6,014,316 A | 1/2000 | Eide | |
| 6,021,048 A | 2/2000 | Smith | |
| 6,025,642 A | 2/2000 | Burns | |
| 6,028,352 A | 2/2000 | Eide | |
| 6,028,358 A | 2/2000 | Suzuki | |
| 6,028,365 A | 2/2000 | Akram et al. | |
| 6,030,856 A | 2/2000 | DiStefano et al. | |
| 6,034,878 A | 3/2000 | Osaka et al. | |
| 6,040,624 A | 3/2000 | Chambers et al. | |
| 6,072,233 A | 6/2000 | Corisis et al. | |
| 6,080,264 A | 6/2000 | Ball | |
| 6,084,293 A | 7/2000 | Ohuchi | |
| 6,084,294 A | 7/2000 | Tomita | |
| 6,084,778 A | 7/2000 | Malhi | |
| 6,091,145 A | 7/2000 | Clayton | |
| 6,097,087 A | 8/2000 | Farnworth et al. | |
| 6,104,089 A | 8/2000 | Akram | |
| 6,121,676 A | 9/2000 | Solberg | |
| RE36,916 E | 10/2000 | Moshayedi | |
| 6,133,640 A | 10/2000 | Leedy | |
| 6,137,164 A | 10/2000 | Yew et al. | |
| 6,157,541 A | 12/2000 | Hacke | |
| 6,166,443 A | 12/2000 | Inaba et al. | |
| 6,172,418 B1 | 1/2001 | Iwase | |
| 6,172,874 B1 * | 1/2001 | Bartilson | 361/719 |
| 6,180,881 B1 | 1/2001 | Isaak | |
| 6,187,652 B1 | 2/2001 | Chou et al. | |
| 6,205,654 B1 | 3/2001 | Burns | |
| 6,208,571 B1 | 3/2001 | Ikeda | |
| 6,214,641 B1 | 4/2001 | Akram | |
| 6,222,737 B1 | 4/2001 | Ross | |
| 6,222,739 B1 | 4/2001 | Bhakta et al. | |
| 6,225,688 B1 | 5/2001 | Kim et al. | |
| 6,232,659 B1 | 5/2001 | Clayton | |
| 6,233,650 B1 | 5/2001 | Johnson et al. | |
| 6,234,820 B1 | 5/2001 | Perino et al. | |
| 6,239,496 B1 | 5/2001 | Asada | |
| 6,262,476 B1 | 7/2001 | Vidal | |
| 6,262,895 B1 | 7/2001 | Forthun | |
| 6,265,660 B1 | 7/2001 | Tandy | |
| 6,265,766 B1 | 7/2001 | Moden | |
| 6,266,252 B1 | 7/2001 | Karabatsos | |
| 6,268,649 B1 | 7/2001 | Corisis et al. | |
| 6,281,577 B1 | 8/2001 | Oppermann et al. | |
| 6,288,924 B1 | 9/2001 | Sugano et al. | |
| 6,294,406 B1 | 9/2001 | Bertin et al. | |
| 6,300,163 B1 | 10/2001 | Akram | |
| 6,300,679 B1 | 10/2001 | Mukerji et al. | |
| 6,303,981 B1 | 10/2001 | Moden | |
| 6,303,997 B1 | 10/2001 | Lee | |
| 6,310,392 B1 | 10/2001 | Burns | |
| 6,313,522 B1 | 11/2001 | Akram et al. | |
| 6,313,998 B1 | 11/2001 | Kledzik | |
| 6,316,825 B1 | 11/2001 | Park et al. | |
| 6,316,838 B1 | 11/2001 | Ozawa et al. | |
| 6,323,060 B1 | 11/2001 | Isaak | |
| 6,329,708 B1 | 12/2001 | Komiyama | |
| 6,329,713 B1 | 12/2001 | Farquhar et al. | |
| 6,336,262 B1 | 1/2002 | Dalal et al. | |
| 6,339,254 B1 | 1/2002 | Venkateshwaran et al. | |
| 6,351,029 B1 | 2/2002 | Isaak | |
| 6,360,433 B1 | 3/2002 | Ross | |
| 6,368,896 B2 | 4/2002 | Farnworth et al. | |
| 6,376,769 B1 | 4/2002 | Chung | |
| 6,388,207 B1 * | 5/2002 | Figueroa et al. | 174/262 |
| 6,388,333 B1 | 5/2002 | Taniguchi et al. | |
| 6,392,162 B1 | 5/2002 | Karabatsos | |
| 6,392,953 B2 | 5/2002 | Yamada et al. | |
| 6,404,043 B1 | 6/2002 | Isaak | |
| 6,404,049 B1 | 6/2002 | Shibamoto et al. | |
| 6,410,857 B1 | 6/2002 | Gonya | |
| 6,414,384 B1 | 7/2002 | Lo et al. | |
| 6,426,240 B2 | 7/2002 | Isaak | |
| 6,426,549 B1 | 7/2002 | Isaak | |
| 6,428,360 B2 | 8/2002 | Hassanzadeh | |
| 6,433,418 B1 | 8/2002 | Fujisawa et al. | |
| 6,437,990 B1 | 8/2002 | Degani et al. | |
| 6,444,490 B2 | 9/2002 | Bertin et al. | |
| 6,444,921 B1 | 9/2002 | Wang et al. | |
| 6,446,158 B1 | 9/2002 | Karabatsos | |
| 6,449,159 B1 | 9/2002 | Haba | |
| 6,452,826 B1 | 9/2002 | Kim et al. | |
| 6,462,408 B1 | 10/2002 | Wehrly, Jr. | |
| 6,462,412 B2 | 10/2002 | Kamei et al. | |
| 6,462,421 B1 | 10/2002 | Hsu et al. | |
| 6,465,877 B1 | 10/2002 | Farnworth et al. | |
| 6,465,893 B1 | 10/2002 | Khandros et al. | |
| 6,472,735 B2 | 10/2002 | Isaak | |
| 6,473,308 B2 * | 10/2002 | Forthun | 361/749 |
| 6,486,544 B1 | 11/2002 | Hashimoto | |
| 6,489,178 B2 | 12/2002 | Coyle et al. | |
| 6,489,687 B1 | 12/2002 | Hashimoto | |
| 6,492,718 B2 | 12/2002 | Ohmori | |
| 6,504,104 B2 | 1/2003 | Hacke et al. | |
| 6,509,639 B1 | 1/2003 | Lin | |
| 6,514,793 B2 | 2/2003 | Isaak | |
| 6,514,794 B2 | 2/2003 | Haba et al. | |
| 6,521,530 B2 | 2/2003 | Peters et al. | |
| 6,522,018 B1 | 2/2003 | Tay et al. | |
| 6,522,022 B2 | 2/2003 | Murayama | |
| 6,525,413 B1 | 2/2003 | Cloud et al. | |
| 6,528,870 B2 | 3/2003 | Fukatsu et al. | |
| 6,531,337 B1 | 3/2003 | Akram et al. | |
| 6,531,338 B2 | 3/2003 | Akram et al. | |
| 6,532,162 B2 | 3/2003 | Schoenborn | |
| 6,552,910 B1 | 4/2003 | Moon et al. | |
| 6,560,117 B2 | 5/2003 | Moon | |
| 6,563,217 B2 | 5/2003 | Corisis et al. | |
| 6,572,387 B2 | 6/2003 | Burns et al. | |
| 6,573,593 B1 | 6/2003 | Syri et al. | |
| 6,576,992 B1 | 6/2003 | Cady et al. | |
| 6,583,502 B2 | 6/2003 | Lee et al. | |
| 6,590,282 B1 | 7/2003 | Wang et al. | |
| 6,600,222 B1 | 7/2003 | Levardo | |
| 6,603,198 B2 | 8/2003 | Akram et al. | |
| 6,608,763 B1 | 8/2003 | Burns et al. | |
| 6,614,664 B2 | 9/2003 | Lee | |
| 6,620,651 B2 | 9/2003 | He et al. | |
| 6,627,984 B2 | 9/2003 | Bruce et al. | |
| 6,646,335 B2 | 11/2003 | Emoto | |
| 6,646,936 B2 | 11/2003 | Hamamatsu | |
| 6,650,588 B2 | 11/2003 | Yamagata | |
| 6,657,134 B2 | 12/2003 | Spielberger et al. | |
| 6,660,561 B2 | 12/2003 | Forthun | |
| 6,661,092 B2 | 12/2003 | Shibata et al. | |
| 6,673,651 B2 | 1/2004 | Ohuchi et al. | |
| 6,674,644 B2 | 1/2004 | Schulz | |
| 6,677,670 B2 | 1/2004 | Kondo | |
| 6,683,377 B1 | 1/2004 | Shim et al. | |
| 6,686,656 B1 | 2/2004 | Koh et al. | |
| 6,690,584 B2 | 2/2004 | Uzuka et al. | |
| 6,699,730 B2 | 3/2004 | Kim et al. | |
| 6,707,684 B1 | 3/2004 | Andric et al. | |
| 6,710,437 B2 | 3/2004 | Takahashi et al. | |
| 6,720,652 B2 | 4/2004 | Akram et al. | |
| 6,721,226 B2 | 4/2004 | Woo et al. | |
| 6,726,346 B2 | 4/2004 | Shoji | |
| 6,737,742 B2 | 5/2004 | Sweterlitsch | |
| 6,737,891 B2 | 5/2004 | Karabatsos | |
| 6,740,981 B2 | 5/2004 | Hosomi | |
| 6,746,894 B2 | 6/2004 | Fee et al. | |
| 6,756,661 B2 | 6/2004 | Tsuneda et al. | |
| 6,759,737 B2 | 7/2004 | Seo et al. | |
| 6,760,220 B2 | 7/2004 | Canter et al. | |
| 6,765,288 B2 | 7/2004 | Damberg | |

| | | |
|---|---|---|
| 6,768,660 B2 | 7/2004 | Kong et al. |
| 6,774,475 B2 | 8/2004 | Blackshear et al. |
| 6,777,794 B2 | 8/2004 | Nakajima |
| 6,781,240 B2 | 8/2004 | Choi et al. |
| 6,788,560 B2 | 9/2004 | Sugano et al. |
| 6,798,057 B2 | 9/2004 | Bolkin et al. |
| 6,812,567 B2 | 11/2004 | Kim et al. |
| 6,815,818 B2 | 11/2004 | Moore et al. |
| 6,826,066 B2 | 11/2004 | Kozaru |
| 6,833,984 B1 | 12/2004 | Belgacem |
| 6,838,761 B2 | 1/2005 | Karnezos |
| 6,839,266 B1 | 1/2005 | Garrett et al. |
| 6,841,868 B2 | 1/2005 | Akram et al. |
| 6,849,949 B1 | 2/2005 | Lyu et al. |
| 6,850,414 B2 | 2/2005 | Benisek et al. |
| 6,853,064 B2 | 2/2005 | Bolken et al. |
| 6,858,910 B2 | 2/2005 | Coyle et al. |
| 6,869,825 B2 | 3/2005 | Chiu |
| 6,873,039 B2 | 3/2005 | Beroz et al. |
| 6,876,074 B2 | 4/2005 | Kim |
| 6,878,571 B2 | 4/2005 | Isaak et al. |
| 6,884,653 B2 | 4/2005 | Larson |
| 6,893,897 B2 | 5/2005 | Sweterlitsch |
| 6,897,565 B2 | 5/2005 | Pflughaupt et al. |
| 6,906,416 B2 | 6/2005 | Karnezos |
| 6,908,792 B2 | 6/2005 | Bruce et al. |
| 6,910,268 B2 | 6/2005 | Miller |
| 6,913,949 B2 | 7/2005 | Pflughaupt et al. |
| 6,914,324 B2 | 7/2005 | Rapport et al. |
| 6,919,626 B2 | 7/2005 | Burns |
| 6,927,471 B2 | 8/2005 | Salmon |
| 6,940,158 B2 | 9/2005 | Haba et al. |
| 6,940,729 B2 | 9/2005 | Cady et al. |
| 6,943,454 B1 | 9/2005 | Gulachenski et al. |
| 6,956,883 B2 | 10/2005 | Kamoto |
| 6,970,362 B1 * | 11/2005 | Chakravorty ............... 361/782 |
| 6,972,481 B2 | 12/2005 | Karnezos |
| 6,977,440 B2 | 12/2005 | Pflughaupt et al. |
| 6,978,538 B2 | 12/2005 | DiStefano et al. |
| 6,989,285 B2 | 1/2006 | Ball |
| 7,011,981 B2 | 3/2006 | Kim et al. |
| 7,023,701 B2 | 4/2006 | Stocken et al. |
| 7,053,485 B2 | 5/2006 | Bang et al. |
| 7,053,486 B2 | 5/2006 | Shizuno |
| 7,057,278 B2 | 6/2006 | Naka et al. |
| 7,061,088 B2 | 6/2006 | Karnezos |
| 7,061,121 B2 | 6/2006 | Haba |
| 7,061,122 B2 | 6/2006 | Kim et al. |
| 7,064,426 B2 | 6/2006 | Karnezos |
| 7,071,547 B2 | 7/2006 | Kang et al. |
| 7,078,793 B2 | 7/2006 | Ruckerbauer et al. |
| 7,102,221 B2 | 9/2006 | Miyamoto et al. |
| 7,109,576 B2 | 9/2006 | Bolken et al. |
| 7,115,982 B2 | 10/2006 | Moxham |
| 7,115,986 B2 | 10/2006 | Moon et al. |
| 7,120,031 B2 * | 10/2006 | Chakravorty et al. ........ 361/762 |
| 7,129,571 B2 | 10/2006 | Kang |
| 7,149,095 B2 | 12/2006 | Warner et al. |
| 7,161,237 B2 | 1/2007 | Lee |
| 2001/0013423 A1 | 8/2001 | Dalal et al. |
| 2001/0040793 A1 | 11/2001 | Inaba |
| 2002/0006032 A1 | 1/2002 | Karabatsos |
| 2002/0094603 A1 | 7/2002 | Isaak |
| 2002/0180022 A1 * | 12/2002 | Emoto ........................ 257/686 |
| 2002/0196612 A1 | 12/2002 | Gall et al. |
| 2003/0064548 A1 | 4/2003 | Isaak |
| 2003/0090879 A1 | 5/2003 | Doblar et al. |
| 2003/0116835 A1 | 6/2003 | Miyamoto et al. |
| 2003/0159278 A1 | 8/2003 | Peddle |
| 2004/0075991 A1 | 4/2004 | Haba et al. |
| 2004/0109398 A1 * | 6/2004 | Wu et al. .................... 369/47.3 |
| 2004/0115866 A1 | 6/2004 | Bang et al. |
| 2004/0150107 A1 | 8/2004 | Cha et al. |
| 2004/0157749 A1 * | 8/2004 | Ely et al. .................... 507/200 |
| 2004/0170006 A9 * | 9/2004 | Sylvester et al. ............ 361/794 |
| 2004/0217461 A1 | 11/2004 | Damberg |
| 2004/0217471 A1 | 11/2004 | Haba |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0108468 A1 | 5/2005 | Hazelzet et al. |
| 2005/0133897 A1 | 6/2005 | Baek et al. |

* cited by examiner

FLEX CIRCUIT APPARATUS AND METHOD FOR ADDING CAPACITANCE WHILE CONSERVING CIRCUIT BOARD SURFACE AREA

BACKGROUND

On densely populated circuit boards, space consumption is a critical issue. Each additional component placed on a circuit board takes up additional surface area. For example, if more capacitance is required for a given application, additional capacitors must be added to the circuit board, taking up additional surface area. With manufacturers trying to fit more and more components on circuit boards, techniques which minimize the amount of surface area of given components are sought after. This applies to capacitors as much as other components.

At the same time, manufacturers are constantly looking for ways to reduce overall circuit board surface area. Stacking is one technique that has been utilized to conserve surface area. One such stacking technique stacks integrated circuits on top of one another. In U.S. Pat. No. 6,576,992 B1 (the '992 patent), owned by assignee of the present application and incorporated herein by reference, integrated circuits are stacked in chip-scale packages ("CSPs") into modules. Flex circuits are used to connect a pair of CSPs, conserving board surface area at the expense of added component height. This is a trade-off that manufacturers are often willing to make to allow smaller circuit boards.

SUMMARY

An apparatus for adding capacitance while conserving circuit board surface area is provided that includes a flex capacitor circuit with an upper surface and a lower surface and a plurality of conductive layers and an integrated-circuit (IC) device mounted on to the upper surface of the flex capacitor circuit and electrically connected to the flex capacitor circuit. The flex capacitor circuit is configured to provide bypass capacitance and, therefore, adds capacitance to the IC device when the IC device is mounted on the flex capacitor circuit.

Another apparatus for adding capacitance while conserving circuit board surface area includes a flex capacitor circuit with an upper surface and a lower surface and an integrated-circuit (IC) device mounted on to the upper surface of the flex capacitor circuit. The flex capacitor circuit includes a plurality of conductive layers, one or more dielectric layers, and a plurality of vias. Each conductive layer is a solid plane except for openings for vias defined by the conductive layer. The one or more dielectric layers separate the conductive layers. The vias extend through openings in the conductive layers and provide electrical connections to the conductive layers and electrical connections for communicating a signal through the flex capacitor circuit. The integrated-circuit (IC) device is electrically connected to the vias in the flex capacitor circuit. The flex capacitor circuit adds capacitance to the IC device.

A preferred method in accordance with the invention includes obtaining a flex capacitor circuit with an upper surface and a lower surface and a plurality of conductive layers, mounting an IC device on the upper surface of the flex capacitor circuit, and mounting the flex capacitor circuit on a circuit board. Mounting the IC device to the upper surface of the flex capacitor circuit creates an electrical interconnection between the IC device and the flex capacitor circuit and mounting the flex capacitor circuit on the circuit board creates an electrical interconnection between the IC device and the circuit board through the flex capacitor circuit and, therefore, adds capacitance to the IC device.

BRIEF DESCRIPTION OF THE DRAWINGS

The detailed description will refer to the following drawings, wherein like numerals refer to like elements, and wherein.

DETAILED DESCRIPTION OF PREFERRED EMBODIMENTS

An apparatus and method for adding capacitance while conserving circuit board surface area are described herein. The embodiments described utilize a flex circuit to effectively stack capacitance, providing a vertical solution that allows minimization of circuit board surface area or maximum utilization of available circuit board surface area. The embodiments provide a way of boosting capacitance for devices by using planes of a flex circuit or combination rigid/flex circuit. Certain embodiments provide on the flex circuit a capability of boosting capacitance even more by adding capacitors on top of the package. Embodiments enable the incorporating of these features in the packaging process of a die.

Flex circuits ("flex", "flex circuits" or "flexible circuit structures") employed herein are flexible circuit structures that have at least two conductive layers. The conductive layers are, for example, metal such as copper or alloy 110. Any flexible or conformable substrate with a multiple internal layer connectivity capability may be used as a flex circuit in embodiments. The entire flex circuit may be flexible or, as those of skill in the art will recognize, a printed circuit board ("PCB") structure made flexible in certain areas, to allow conformability and wrapping around, e.g., the CSP, and rigid in other areas for planarity along, e.g., CSP surfaces.

Embodiments may be used, for example, with a die or integrated circuit (IC) device. For example, CSP packages of a variety of types and configurations such as, for example, those that are die-sized, as well as those that are near chip-scale as well as the variety of ball grid array packages known in the art may be used. Typical CSPs, such as, for example, monolithic ball-grid-array ("BGA"), micro ball-grid-array, and fine-pitch ball-grid-array ("FBGA") packages have an array of connective contacts embodied, for example, as leads, bumps, solder balls, or balls that extend from a lower surface of a plastic (or other material) casing in any of several patterns and pitches. An external portion of the connective contacts is often finished with a ball or solder.

Figure 1:
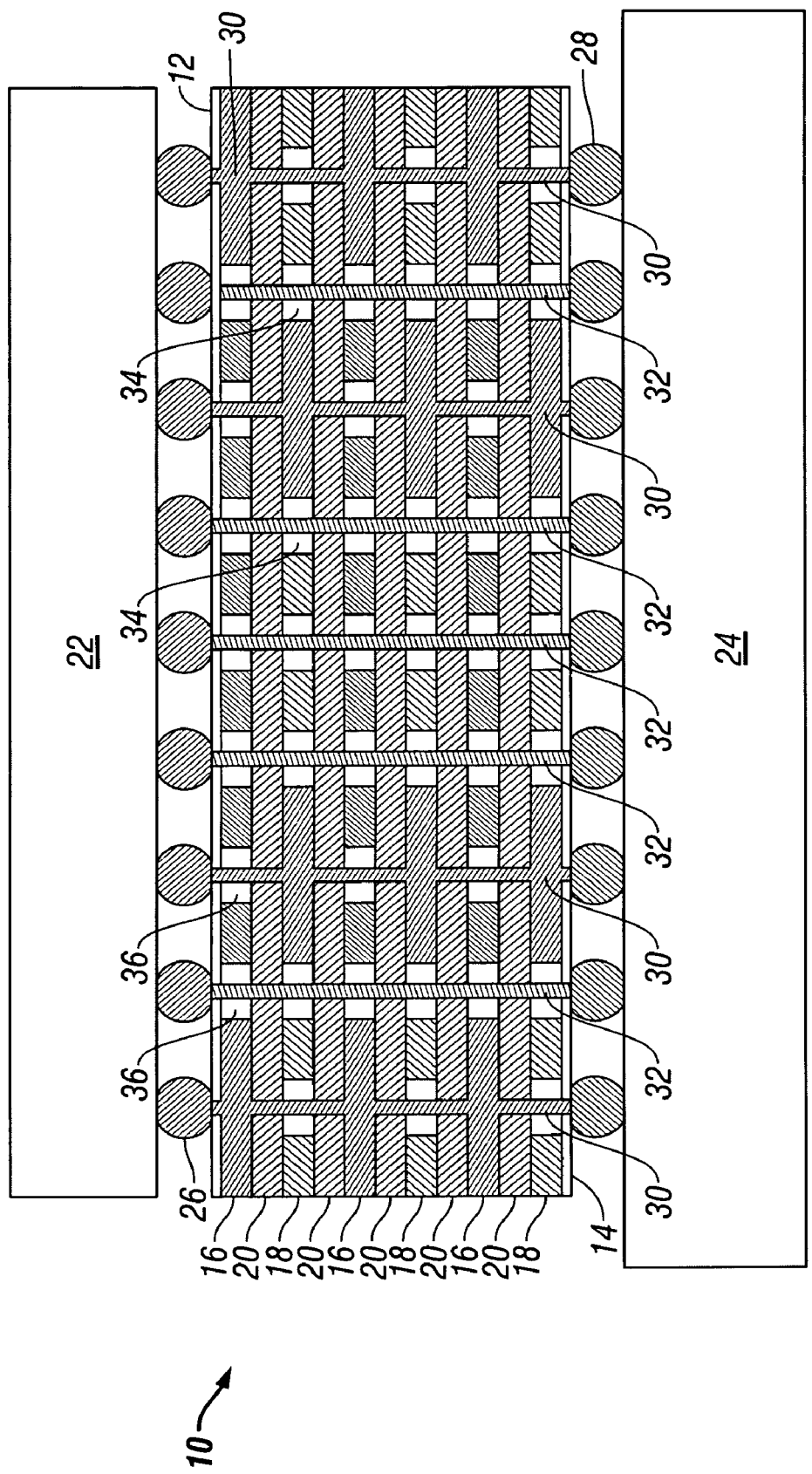
FIG. 1 is a cross-sectional view of an embodiment of a flex-circuit apparatus for adding capacitance while conserving circuit board surface area.

With reference now to FIG. 1, shown is an apparatus for adding capacitance while conserving circuit board surface area. The apparatus includes a multi-layered flex circuit 10 used as a capacitor. In the embodiment shown, flex capacitor circuit 10 includes an upper surface 12 and a lower surface 14 with six (6) intermediate conductive layers which except openings for vias, are solid planes. The six intermediate conductive layers include six (6) alternating power planes (i.e., three (3) "Power 1" planes 16 and three (3) "Power 2" planes 18) separated by dielectric layers 20. One set of power planes, e.g., the Power 1 planes 16, may be configured as a power supply layer, while the other set of power planes, e.g., the Power 2 planes 18, may be configured as a ground layer. The dielectric layers 20 may be any of a variety of flexible dielectrics, such as Kapton™ or C-Ply™, both provided by 3M. As noted above, the conductive layers may be metal such as copper or alloy 110.

The flex capacitor circuit 10 may be mounted between an IC device 22 (e.g., a CSP as described above) and the substrate or circuit board 24 to which the device 22 would normally attach. Mounted as such, the flex capacitor circuit 10 increases the bypass capacitance of the device 22. The flex capacitor circuit 10 does this by providing an electrical connection between device 22 and circuit board 24 power and ground leads and respective power and ground conductive layers (e.g., Power 1 plane(s) 16 and Power 2 plane(s) 18) in the flex capacitor circuit 10. The flex capacitor circuit 10 also provides an electrical connection for a signal to pass through the flex capacitor circuit 10 from/to the device 22 to the circuit board 24.

With continued reference to FIG. 1, connective contacts 26 and connective contacts 28 (e.g., ball contacts) on the upper surface 12 and lower surface 14, respectively, of flex capacitor 10 provide electrical connections through mounting pads (not shown) and supply vias 30 to the conductive layers. The connective contacts 26 and connective contacts 28 also provide the signal connection directly between device 22 and circuit board 24 through mounting pads and non-supply (i.e., signal) vias 32. Contacts 26, 28 may be formed between device 22 and flex capacitor circuit 10, and between flex capacitor circuit 10 and circuit board 24, as part of the mounting process. Device 22 may be mounted to upper surface 12 of flex capacitor circuit 10, while lower surface 14 of flex capacitor circuit 10 may be mounted to circuit board 24. An adhesive may used to bond device 22 to flex capacitor circuit 10 and flex capacitor circuit 10 to the circuit board 24.

As shown, supply vias 30 and signal vias 32 extend through flex capacitor circuit 10. Contacts 26, 28 and vias 30, 32 provide power supply, ground and signal connections between device 22 and circuit board 24 through flex capacitor circuit 10. For example, in the cross-sectional view shown in FIG. 1, there are two sets of supply vias 30 that connect contacts 26, 28 to Power 1 planes 16 (e.g., the power supply conductive layers) in flex capacitor circuit 10. In this manner, flex capacitor circuit 10 may provide a power supply connection, with added capacitance provided by flex capacitor circuit 10, between circuit board 24 and device 22. The supply vias 30 connecting to Power 1 planes 16 are the two outermost supply vias 30 (left-most and right-most) shown in FIG. 1. Supply vias 30 that connect to Power 1 planes 16 do not connect with Power 2 planes 18, but instead pass through openings 34 in Power 2 planes 18. In this manner, these vias 30 provide an electrical connection to Power 1 planes 16 but not Power 2 planes 18.

Similarly, there are two sets of supply vias 30 that connect to Power 2 planes 18 (e.g., the ground conductive layers). Supply vias 30 connecting to Power 2 planes 18 may provide a ground connection for device 22. Supply vias 30 connecting to Power 2 planes 18 do not connect to Power 1 planes, but instead pass through openings 36 in Power 1 planes 16. Supply vias 30 connecting to Power 2 planes 18 are shown as supply vias 30 third from the left and third from the right in FIG. 1.

With continuing reference to FIG. 1, the remaining vias are signal vias 32. Signal vias 32 provide a signal connection between device 22 and circuit board 24, as described above. As shown, signal vias 32 do not connect to Power 1 planes 16 and Power 2 planes 18, but instead pass through openings 34 and 36 in Power 2 planes 18 and Power 1 planes 16, respectively.

By providing power supply, ground and signal connections through power supply vias 30 and vias 32, flex capacitor circuit 10 adds capacitance without taking up any appreciable circuit board 24 surface area beyond that of device 22 itself. The amount of capacitance provided by flex capacitor circuit 10 is a function of a number of variables, as those of skill in the art will recognize, including the surface area, the number of layers, the distance between layers, and the dielectric material of flex capacitor circuit 10. The greater the surface area of flex capacitor circuit 10, the greater the capacitance. The surface area may be increased by known techniques, such as dimpling, rough surface, etc., by extending flex capacitor circuit 10 beyond device 22, or folding flex capacitor circuit 10 over device 22, as described below. There typically is a direct, linear relationship between the surface area and the capacitance provided.

There is also a direct, linear relationship between the number of layers and the capacitance provided by flex capacitor circuit 10. Hence, the greater number of layers, the more capacitance provided. Increasing the number of layers, however, also increases the inductance provided by flex capacitor circuit 10. Consequently, if too much inductance were a concern, a flex capacitor circuit 10 design may include greater surface area but fewer layers.

There is an inverse, linear relationship between the distance between conductive layers and the capacitance provided by flex capacitor circuit 10. In other words, the smaller the distance between the layers, the greater capacitance provided.

On the other hand, there is a direct, linear relationship between the dielectric level of the dielectric material used for dielectric layers 20 and the capacitance provided by flex capacitor circuit 10. In other words the higher the dielectric level of the dielectric material used in the dielectric layers 20, the greater the capacitance. Accordingly, a flex capacitor circuit 10 design might also incorporate a higher dielectric level material rather than increasing the number of layers in order to avoid increasing inductance.

Figure 2A:
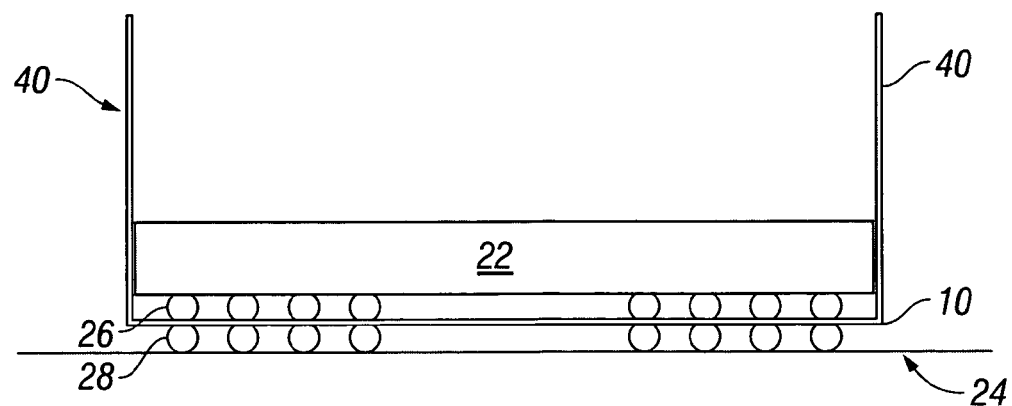
FIGS. 2A-2B are cross-sectional and perspective views, respectively, of an embodiment of a flex circuit apparatus for adding capacitance while conserving circuit board surface area that includes fins.
Figure 2B:
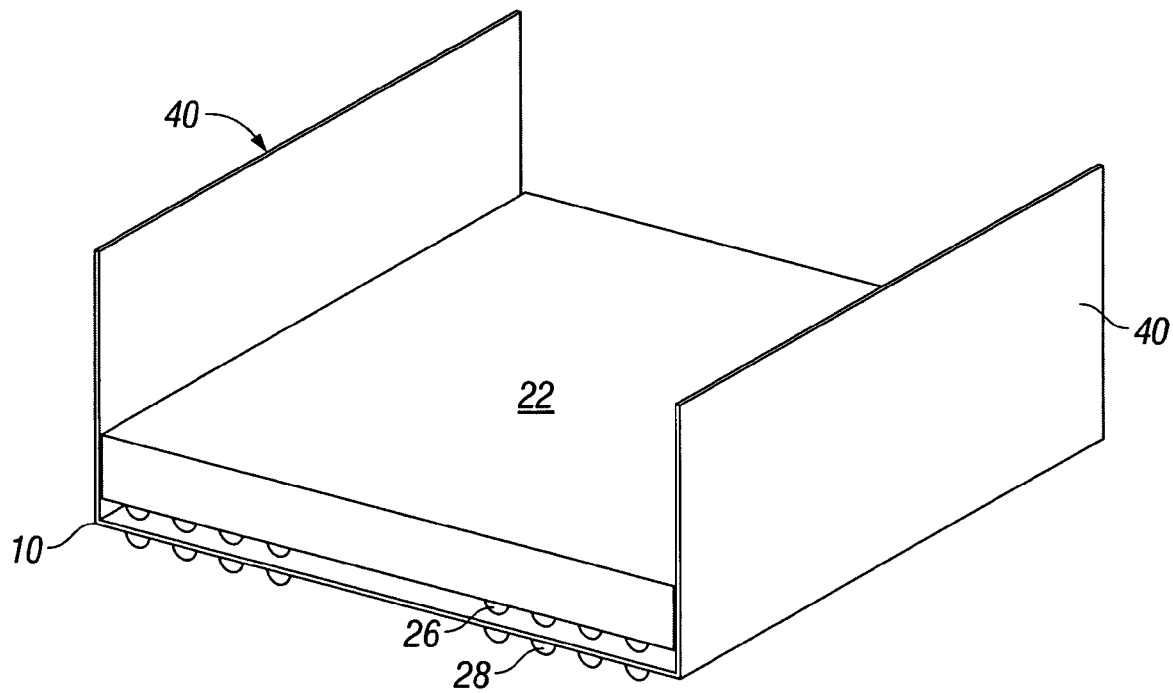

FIGS. 2A-2B depict an embodiment of an apparatus for adding capacitance while conserving circuit board surface area that includes fins 40. Fins 40 may be formed as extended portions of flex capacitor circuit 10. Consequently, fins 40 provide increased surface area for flex capacitor circuit 10. The increased surface area provided by fins 40 increases the capacitance provided by flex capacitor circuit 10.

As shown, device 22 is mounted on flex capacitor circuit 10, which is itself mounted on substrate or circuit board 24. Connective contacts 26, 28 provide power supply, ground, and signal connections between device 22, flex capacitor circuit 10, and circuit board 24, as described above. In FIGS. 2A-2B, fins 40 are shown extended above and perpendicular to device 22. Fins 40 may be folded around (over the top of) device 22 or left exposed (as shown) at any desired angle. An advantage of leaving fins 40 exposed as shown is that exposed fins 40 provide heat dissipation.

Figure 3A:
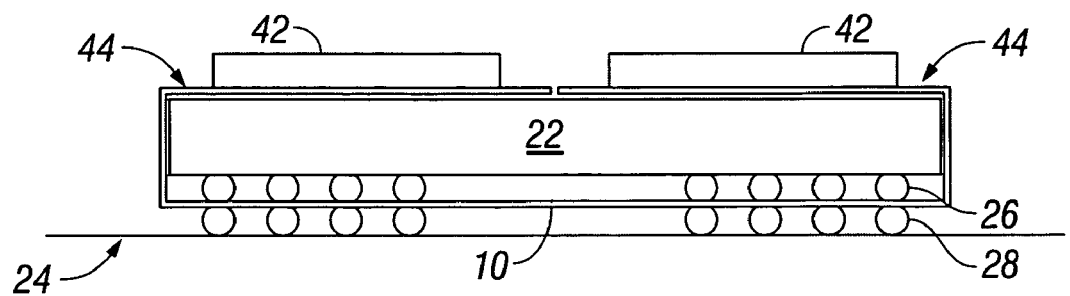
FIGS. 3A-3B are cross-sectional and perspective views, respectively, of an embodiment of a flex circuit apparatus for adding capacitance while conserving circuit board surface area that includes additional capacitors.
Figure 3B:
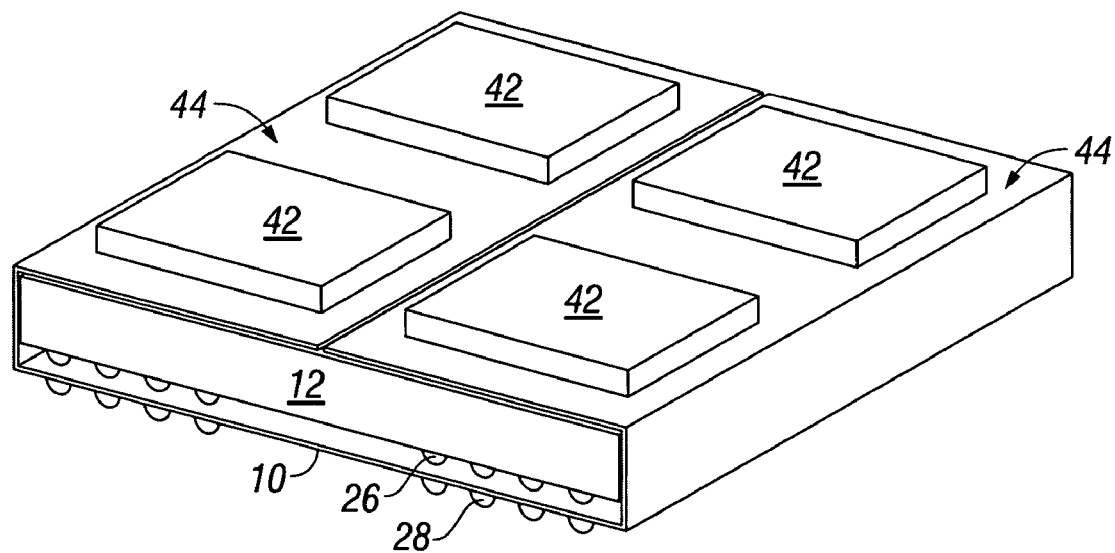

Another feature that can be incorporated with flex capacitor circuit 10 is additional bulk capacitor mounting positions. Extended portions of flex capacitor circuit 10 that are folded over device 22 (or allowed to stand as fins 40) may provide a high-quality, close-proximity mounting for additional bulk capacitors. With reference now to FIGS. 3A-3B, shown is an embodiment of an apparatus for adding capacitance while conserving circuit board surface area that includes additional capacitors 42. As shown, additional capacitors 42 are mounted on portions 44 of flex capacitor circuit 10 folded over device 22.

As shown, the device 22 is mounted on the flex capacitor circuit 10, which is itself mounted on the substrate or circuit board 24. Connective contacts 26, 28 provide power supply, ground, and signal connections between device 22, flex capacitor circuit 10, and circuit board 24, as described above. Folder portions 44 of the flex capacitor circuit 10 wrap around the upper surface of the device 22 and capacitors 42 may be mounted on folded portions 44. Folded portions 44 may include mounting pads (not shown) for mounting capacitors 42. The connections of capacitors 42 to device 22 may also be ported in a fashion normal to standard die packaging procedures to insulate the connections. As shown in FIGS. 3A-3B, flex capacitor circuit 10 may be incorporated with device 22 as a packaged die (e.g., a CSP). Flex capacitor circuit 10 may be easily employed in the manufacture of a packaged die, incorporating capacitance into a monolithic package. Surface mount capacitors 42 can be added to the package, as shown in FIGS. 3A-3B, to increase capacitance as desired. As an example, memory DIMMs utilizing inverted packages such as those shown here can take advantage of this packaging technology to meet overall package outline requirements with larger die sizes.

Figure 4A:
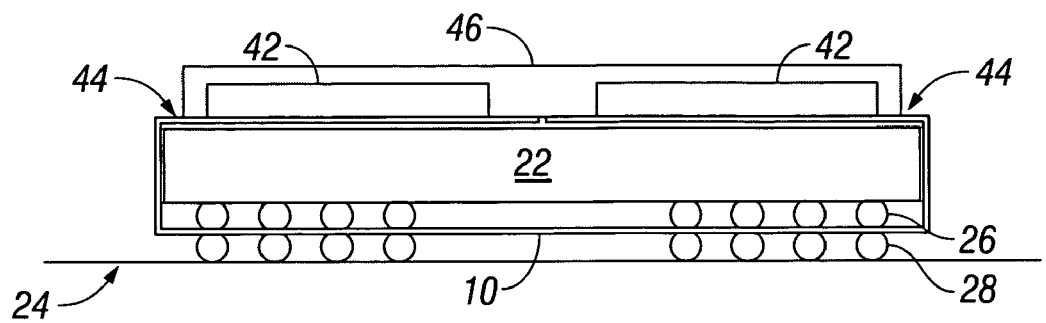
FIGS. 4A-4B are cross-sectional and perspective views, respectively, of an embodiment of a flex circuit apparatus for adding capacitance while conserving circuit board surface area that includes additional capacitors and a slug for transferring heat.
Figure 4B:
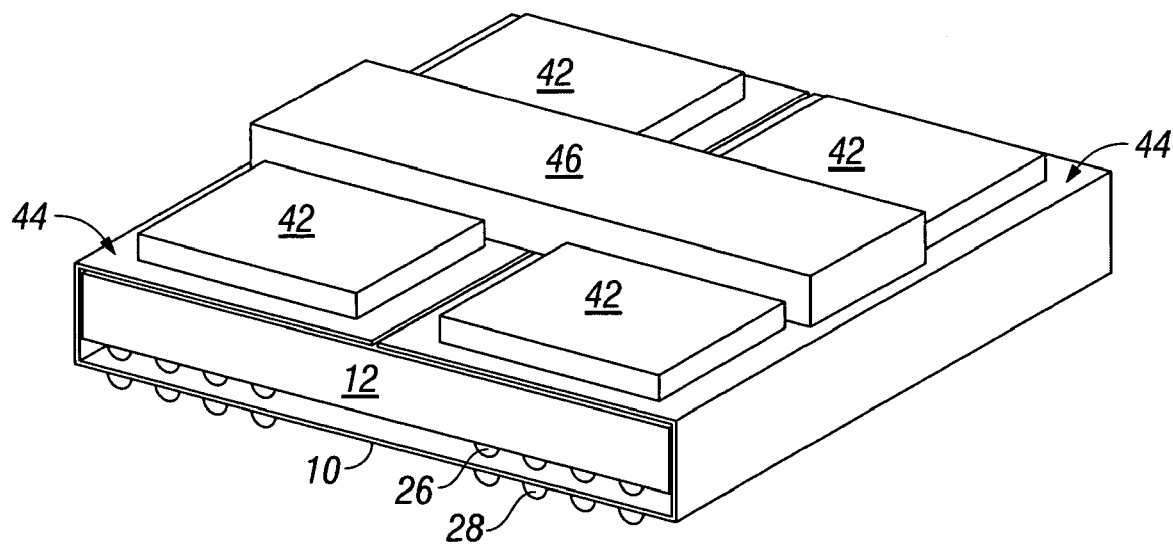

With reference to FIGS. 4A-4B, shown is an embodiment of an apparatus for adding capacitance while conserving circuit board surface area that includes additional capacitors 42 and a slug 46 for transferring heat. As above, additional capacitors 42 are mounted on the folded portions 44 of flex capacitor circuit 10. In the embodiment shown, a slug 46 is also mounted on the package. The slug 46 may be mounted, e.g., on large mounting pads (not shown) on folded portions 44. The surface of folded portions 44 facing device 22 could be plated for solder attachment and multiple vias used to transfer heat to the slug 46 mounted on the outer surface of folded portions 44. Alternatively, a cutout or cutout window in folded portions 44 could be provided to mount slug 46 directly to device 22. Slug 46 may be metal or other heat-conductive material. Slug 46 may interface to a heat sink (not shown) mounted on top of slug 46 or may itself be a heat sink.

Figure 5:
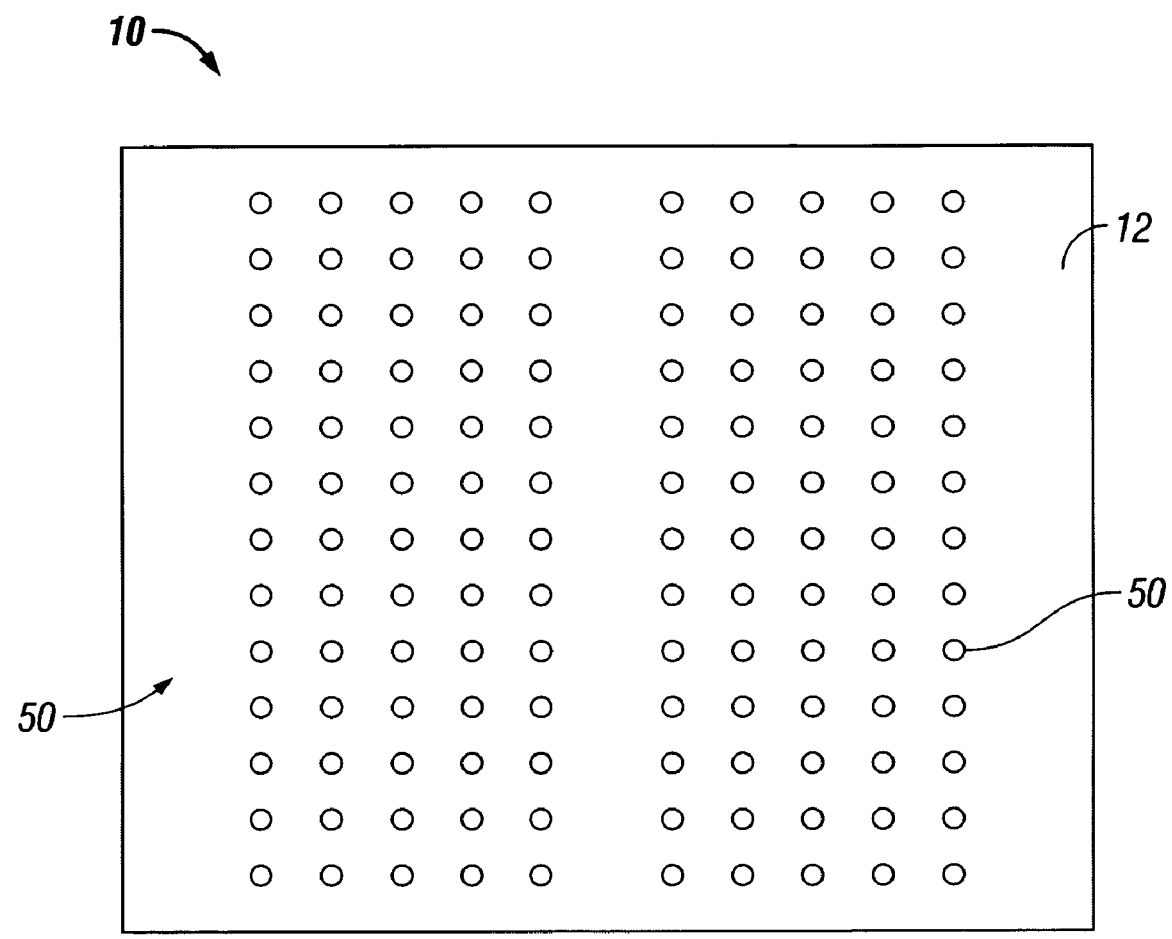
FIG. 5 is a top view of a flex circuit that may be used in embodiments of a flex circuit apparatus for adding capacitance while conserving circuit board surface area.

With reference now to FIG. 5, shown is an embodiment of a flex capacitor circuit 10 that may be used in embodiments of an apparatus for adding capacitance while conserving circuit board surface area. Exemplary flex circuits are shown in the '992 patent discussed above and are known to those skilled in the art. Off-the-shelf flex circuits may be used. As shown, the flex capacitor circuit 10 includes mounting pads 50. The mounting pads 50 provide connections from connective contacts 26, 28 to the vias 30, 32 discussed above. In flex capacitor circuit 10, the power plane layers generally will not have traces, as these are not needed for the capacitance function.

As discussed above, flex capacitor circuit 10 includes power plane layers separated by dielectric layers. The power plane layers may be metal layers that are solid planes with the exception of holes for vias 30, 32. The number of layers may depend on numerous factors including the capacitance desired, engineering and size constraints, and other design choices. For example, flex capacitor circuit 10 in FIG. 1 includes six power plane layers. Generally, flex capacitor circuit 10 will have two or more power plane layers.

In certain embodiments, as discussed above, flex capacitor circuit 10 is folded. Increasing the number of layers of flex capacitor circuit 10 may increase the difficulty of folding flex capacitor circuit 10. There are techniques available for folding multiple-layered flex circuits. For example, flex capacitor circuit 10 may be thinned in the regions where it is folded. This may be done by removing layers or thinning the existing layers in the folding region. If necessary, additional layers may be added, or the layers thickened, in the portions of flex capacitor circuit 10 that extend beyond the folding region. Another technique for folding flex capacitor circuit 10 involves folding only some portion of the layers. For example, if flex capacitor circuit 10 included six layers, only two of the layers may extend beyond and be folded over device 22.

Figure 6:
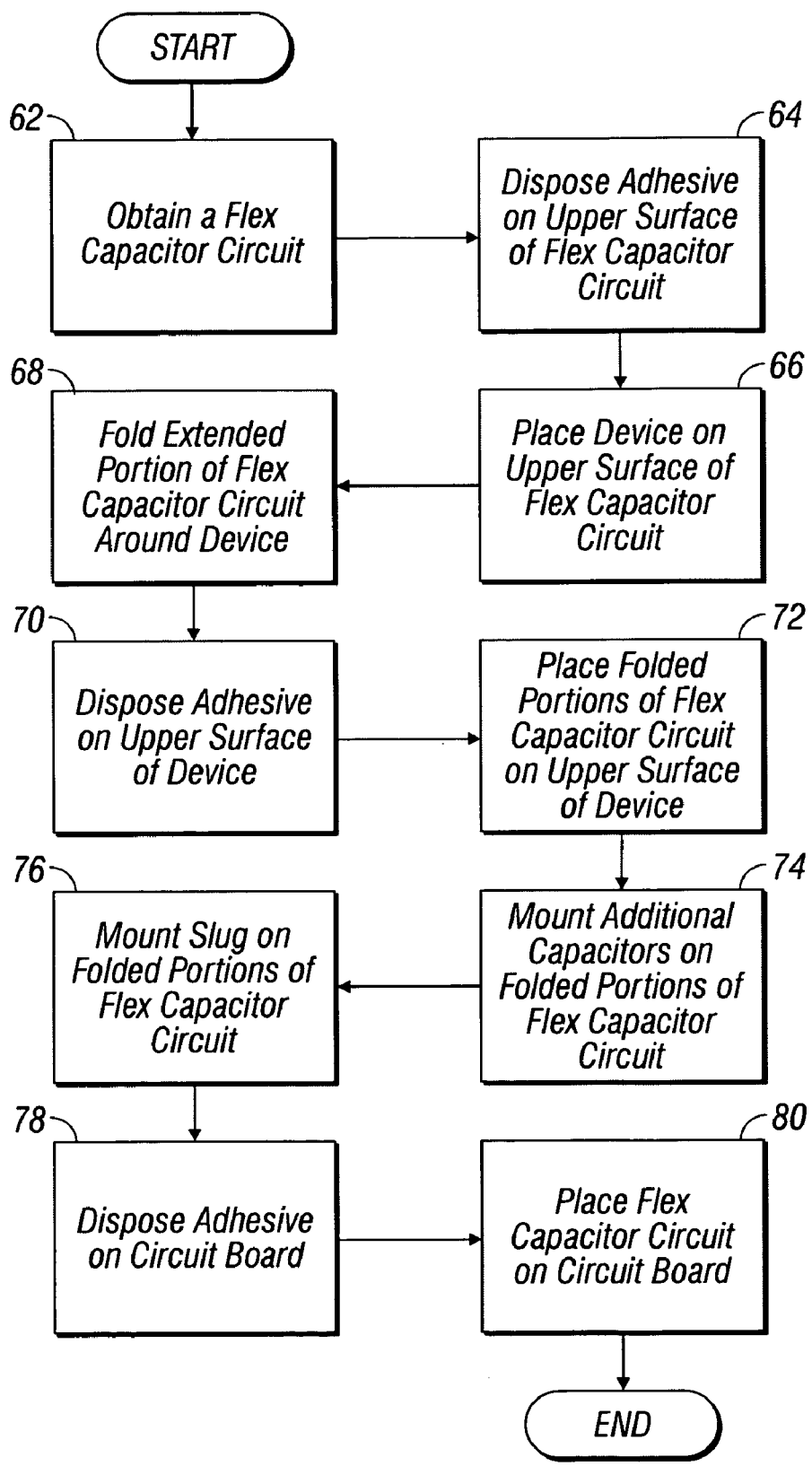
FIG. 6 is a flowchart of an embodiment of a method for adding capacitance while conserving circuit board surface area.

With reference now to FIG. 6, shown is a method 60 for adding capacitance while conserving circuit board surface area. Method 60 includes obtaining a flex capacitor circuit 10, block 62, such as described above with reference to FIGS. 1-5. The obtaining step may comprise fabricating a flex capacitor circuit 10 with the characteristics described above. A device 22 may be mounted on the flex capacitor circuit 10. This mounting may include an adhesive, or other bonding material, being disposed on selected areas of an upper surface of the flex capacitor circuit 10, block 64, and device 22, such as a CSP, being placed on the upper surface of the flex capacitor circuit 10, block 66, creating an adhesive contact between device 22 and flex capacitor circuit 10 and an electrical interconnection between device 22 and flex capacitor circuit 10 through contacts 26 (e.g., contact balls disposed during mounting step), mounting pads 50 and vias 30, 32. If flex capacitor circuit 10 includes an extended portion, the extended portion may be wrapped or folded around device 22, block 68. The folded portion may be left exposed as fins 40 or folded completely over device 22 as discussed above. If folded over device 22, adhesive or other bonding material, may be disposed on an upper surface of device 22, block 70, and the folded portions 44 placed on the upper surface of device 22, block 72, creating an adhesive contact between the upper surface of device 22 and folded portions 44. One or more additional capacitors 42 may be mounted on the folded portions 44, block 74. Likewise, a slug or heat sink may be mounted on the folded portions 44, block 76.

The entire package of device 22 and flex capacitor circuit 10 may be mounted on a circuit board 24. For example, adhesive, or other bonding material, may be disposed on the circuit board 24, block 78, and the package placed on the circuit board 24, block 80, creating an adhesive contact between flex capacitor circuit 10 and the circuit board 24 and an electrical interconnection between device 22 and circuit board 24 through flex capacitor circuit 10 (i.e., through contacts 26, 28 (e.g., contact balls disposed during mounting step), mounting pads 50 and vias 30, 32).

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

The invention claimed is:

1. An apparatus for adding capacitance while conserving circuit board surface area, comprising:
    a flex capacitor circuit with an upper surface and a lower surface, wherein the flex capacitor circuit includes:
        a plurality of conductive layers, wherein each conductive layer is a solid plane except for openings for vias defined by the conductive layer;
        one or more dielectric layers, wherein the one or more dielectric layers separate the conductive layers, wherein the plurality of conductive layers and the one or more dielectric layers form first and second capacitor layers having a common conductive layer; and
        a plurality of vias extending through openings in the conductive layers, wherein the vias provide electrical connections to the conductive layers and electrical connections for communicating a signal through the flex capacitor circuit;
    an integrated-circuit (IC) device mounted on to the upper surface of the flex capacitor circuit and electrically connected to the vias in the flex capacitor circuit;
    the flex capacitor circuit including a folded portion that folds around and encloses the IC device;
    a slug mounted on the folded portion of the flex capacitor circuit, wherein the slug dissipates heat from the IC device; and
    the folded portion defines a cutout window and the slug is mounted to the IC device through the cutout window.

2. An apparatus for adding capacitance while conserving circuit board surface area, comprising:
    a flex capacitor circuit with an upper surface and a lower surface and a plurality of conductive layers, wherein the flex capacitor circuit is configured to provide bypass capacitance, wherein the plurality of conductive layers and one or more dielectric layers form first and second capacitor layers having a common conductive layer; and
    an integrated-circuit (IC) device mounted on to the upper surface of the flex capacitor circuit and electrically connected to the flex capacitor circuit, wherein the flex capacitor circuit adds capacitance to the IC device;
    the flexible capacitor circuit includes one or more heat dissipating slugs mounted on the flexible capacitor circuit in close proximity to the IC device; and
    the flexible capacitor circuit defines a cutout window and the slug is mounted to the IC device through the cutout window.

3. An apparatus for adding capacitance while conserving circuit board surface area, comprising:
    a flex capacitor circuit comprising:
        a plurality of conductive layers, wherein each conductive layer is a solid plane except for openings for vias defined by the conductive layer;
        one or more dielectric layers, wherein the one or more dielectric layers separate the conductive layers;
        a plurality of vias extending through openings in the conductive layers, wherein the vias provide electrical connections to the conductive layers and electrical connections for communicating a signal through the flex capacitor circuit;
        an integrated-circuit (IC) device mounted on to the upper surface of the flex capacitor circuit and electrically connected to the vias in the flex capacitor circuit;
        a folded portion that encloses the IC device and that has a slug mounted thereto to dissipate heat from the IC device, wherein the folded portion defines a cutout window and the slug is mounted to the IC device through the cutout window.

* * * * *